(12) United States Patent
Kobayashi

(10) Patent No.: US 7,864,122 B2
(45) Date of Patent: Jan. 4, 2011

(54) ELECTRONIC DEVICE

(75) Inventor: Koichi Kobayashi, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 677 days.

(21) Appl. No.: 11/889,008

(22) Filed: Aug. 8, 2007

(65) Prior Publication Data

US 2008/0055166 A1 Mar. 6, 2008

(30) Foreign Application Priority Data

Sep. 1, 2006 (JP) .............................. 2006-237956

(51) Int. Cl.
*H01Q 1/24* (2006.01)
*H01Q 1/42* (2006.01)

(52) U.S. Cl. ...................... 343/702; 343/872
(58) Field of Classification Search ............... None
See application file for complete search history.

(56) References Cited

U.S. PATENT DOCUMENTS

| | | | |
|---|---|---|---|
| 6,625,013 B2 * | 9/2003 | Minaguchi et al. ..... | 361/679.55 |
| 7,423,605 B2 * | 9/2008 | Qi et al. ................. | 343/818 |
| 7,561,107 B2 * | 7/2009 | Al-Mahdawi .......... | 343/700 MS |
| 2002/0193138 A1 | 12/2002 | Chiba et al. | |
| 2009/0295651 A1 * | 12/2009 | Dou et al. ................ | 343/702 |

FOREIGN PATENT DOCUMENTS

| | | |
|---|---|---|
| JP | 07-079110 | 3/1995 |
| JP | 11-031909 | 2/1999 |
| JP | 11-145726 | 5/1999 |
| JP | 2001-077611 | 3/2001 |
| JP | 2001-345419 | 12/2001 |
| JP | 2003-273622 | 9/2003 |
| JP | 2005-347912 | 12/2005 |
| JP | 2006-506928 | 2/2006 |

OTHER PUBLICATIONS

Japanese Office Action dated Sep. 28, 2010.

* cited by examiner

*Primary Examiner*—Trinh V Dinh
(74) *Attorney, Agent, or Firm*—Pillsbury Winthrop Shaw Pittman, LLP

(57) ABSTRACT

According to one embodiment, an electronic device includes a housing, a storage mechanism, a printed wiring board, an antenna element and a component. The storage mechanism and printed wiring board are accommodated in the housing. The antenna element is mounted on the printed wiring board and executes wireless communication. The component adversely affects the wireless communication by the antenna element. The printed wiring board includes a first surface which is opposed to the component, and a second surface which is located on a side opposite to the first surface. The antenna element is mounted on the second surface.

6 Claims, 7 Drawing Sheets

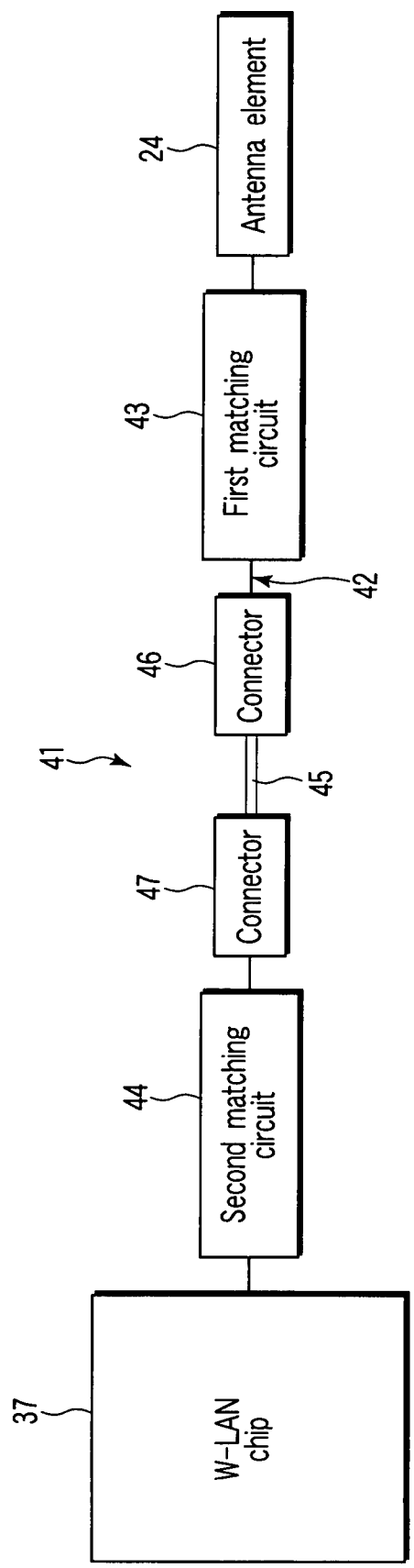
F I G. 6

ELECTRONIC DEVICE

CROSS-REFERENCE TO RELATED APPLICATIONS

This application is based upon and claims the benefit of priority from Japanese Patent Application No. 2006-237956, filed Sep. 1, 2006, the entire contents of which are incorporated herein by reference.

BACKGROUND

1. Field

One embodiment of the invention relates to an electronic device which incorporates a storage mechanism.

2. Description of the Related Art

Jpn. Pat. Appln. KOKAI Publication No. 2003-273622, for instance, discloses an electronic device which incorporates a storage mechanism. This electronic device comprises a housing, a printed wiring board which is accommodated in the housing, a hard disk drive, a battery, a display, and an antenna element which is mounted on the printed wiring board. The antenna element is disposed in an intermediate part in the thickness direction of the housing. The antenna element enables the electronic device to execute wireless communication with another electronic device which is a counterpart of communication.

When the electronic device is placed on a desk in a horizontal position, there may be a case in which radio waves are shut off by the desk. To cope with this problem, in the prior art, the antenna element is disposed in an intermediate part in the thickness direction of the housing and thus a gap is secured between the antenna element and the desk. Thereby, radio waves, which are sent from the antenna element, are prevented from being shut off by the desk, and stable wireless communication is ensured.

However, there are various objects, other than the desk, which adversely affect the wireless communication of the electronic device. In the above-described conventional electronic device, no measure has been taken against such objects which adversely affect the wireless communication, and there has been a room for an improvement.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 6 is an exemplary block diagram showing an electric circuit which is mounted on a printed wiring board of the portable storage device shown in FIG. 1.

DETAILED DESCRIPTION

Various embodiments according to the invention will be described hereinafter with reference to the accompanying drawings. In general, according to one embodiment of the invention, an electronic device comprises a housing, a storage mechanism, a printed wiring board, an antenna element, and a component. The storage mechanism and printed wiring board are accommodated within the housing. The antenna element is mounted on the printed wiring board and executes wireless communication. The component adversely affects the wireless communication by the antenna element. The printed wiring board has a first surface which is opposed to the component, and a second surface which is located on a side opposite to the first surface. The antenna element is mounted on the second surface.

Referring now to FIG. 1 to FIG. 7, an embodiment of a portable storage device, which is an example of the electronic device, will be described.

Figure 1:
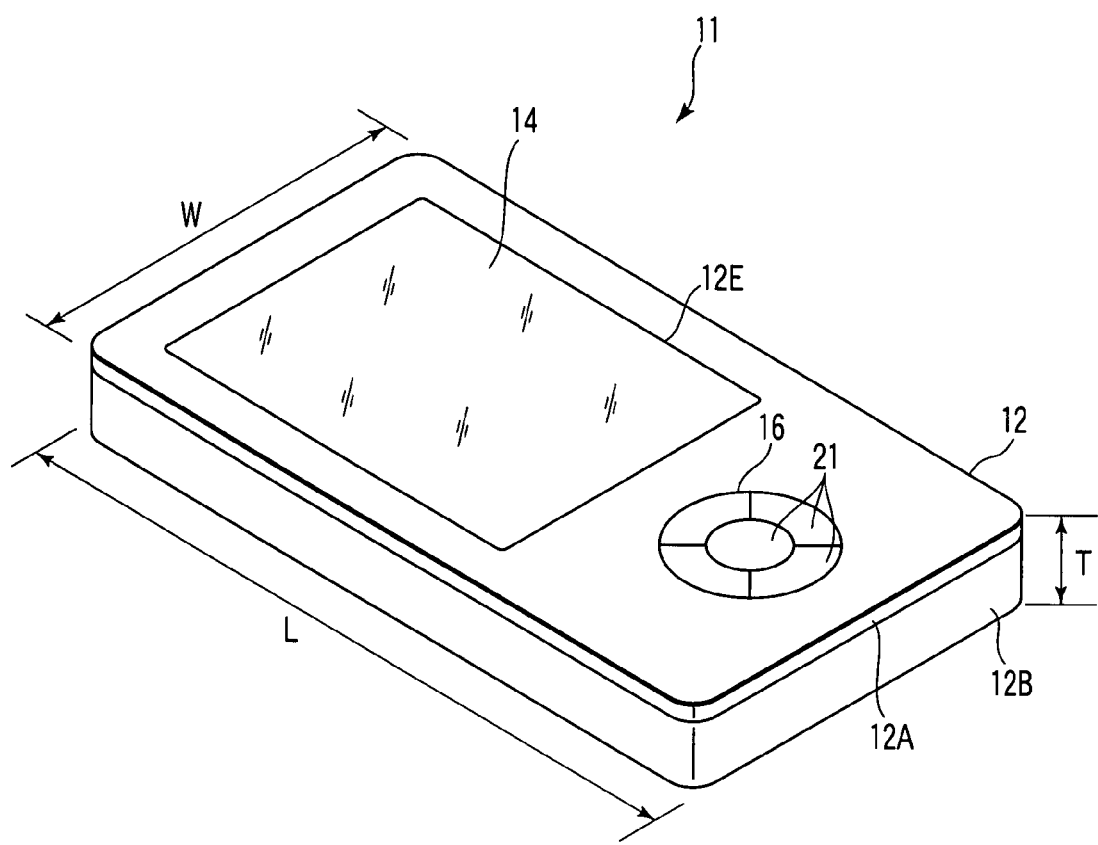
FIG. 1 is an exemplary perspective view showing a portable storage device according to a first embodiment.
Figure 2:
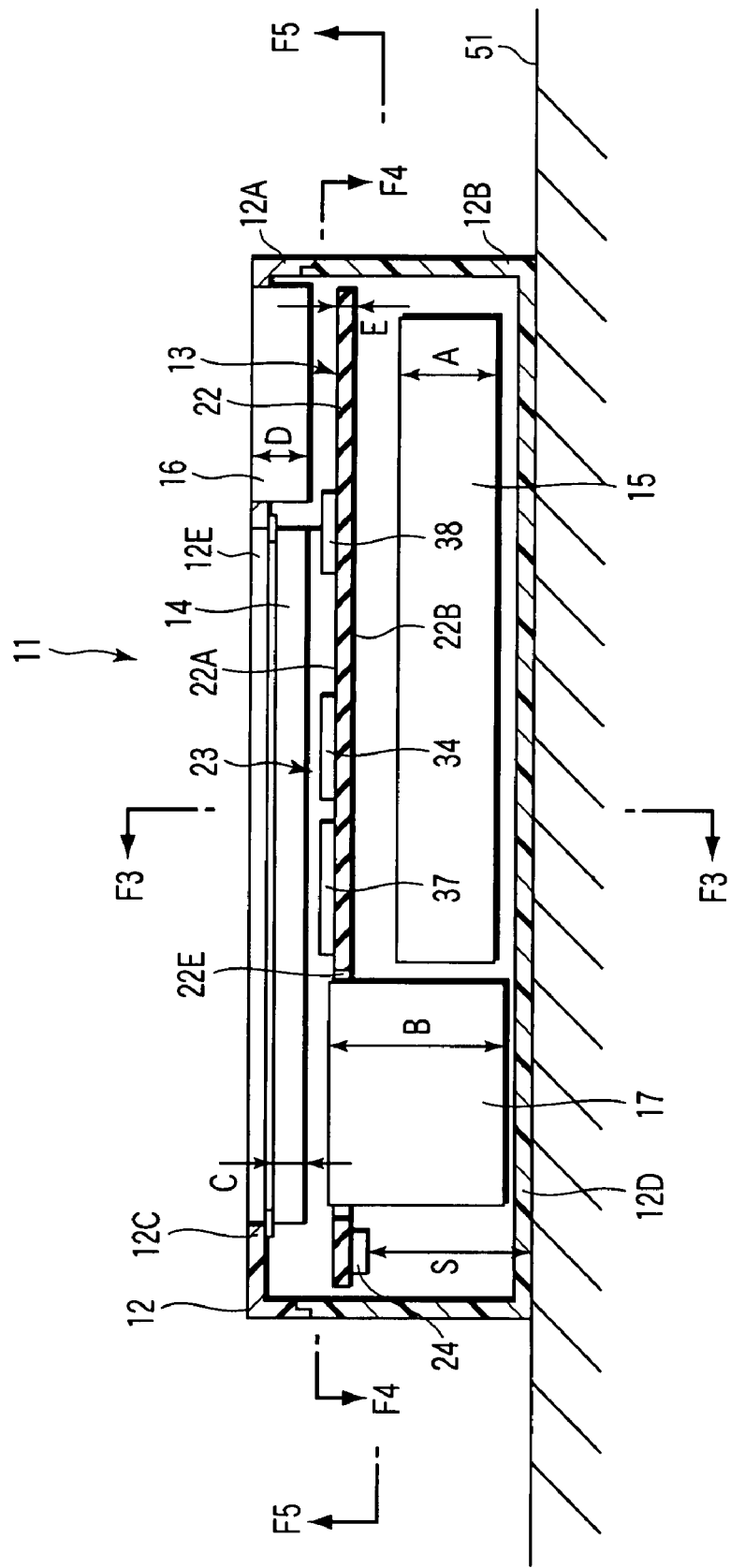
FIG. 2 is an exemplary cross-sectional view of the portable storage device shown in FIG. 1.
Figure 3:
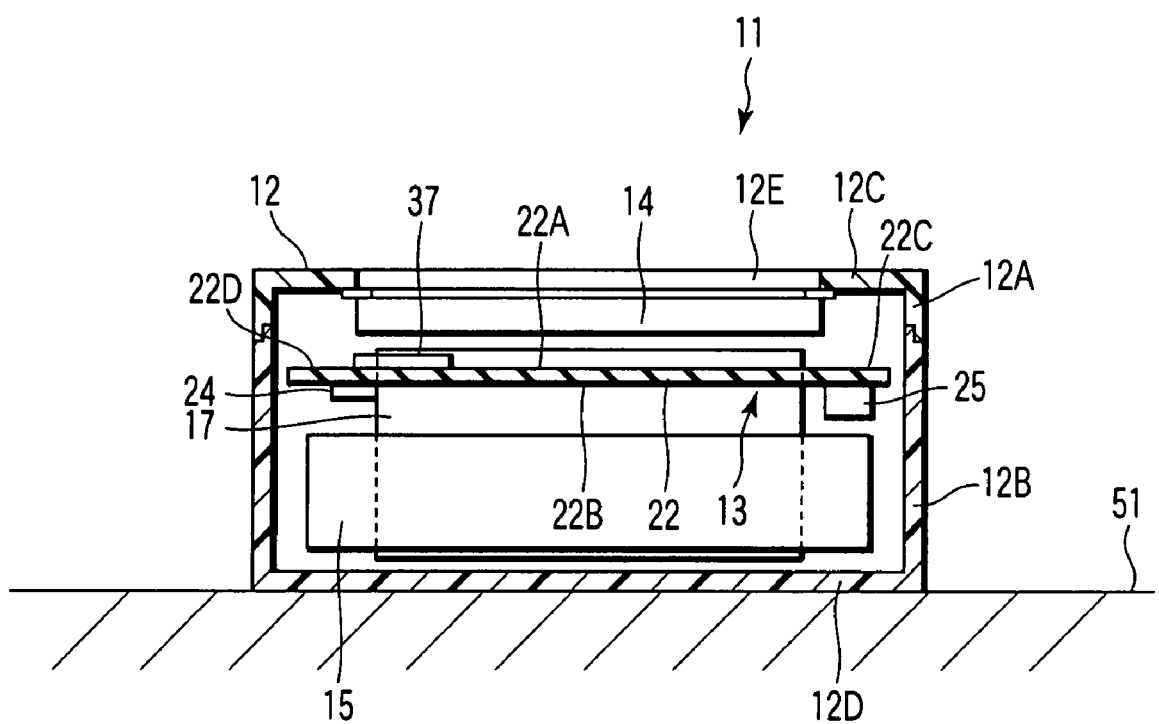
FIG. 3 is an exemplary cross-sectional view, taken along line F3-F3 in FIG. 2, of the portable storage device shown in FIG. 2.

As shown in FIG. 1 to FIG. 3, a portable storage device 11 includes a housing 12, a printed circuit board 13, a liquid crystal display 14, a hard disk drive 15, a manual input device 16, and a battery 17. The housing 12 is formed of a resin in a flat box shape. The housing 12 includes a first half part 12A and a second half part 12B, which are divided as two parts in the thickness direction of the housing 12. As shown in FIG. 2, the housing 12 includes a first wall portion 12C and a second wall portion 12D, which are opposed in the thickness direction. The first wall portion 12C has an opening 12E for exposing the liquid crystal display 14 to the outside. The housing 12 is formed to have a width dimension W of, e.g. 60 mm, a depth dimension L of, e.g. 110 mm, and a thickness dimension T of, e.g. 16 mm. The wall thickness of the housing 12 is, e.g. 1 mm.

The hard disk drive 15, which is an example of the storage mechanism, is accommodated in the housing 12 at a position near the second wall portion 12D. The hard disk drive 15 includes a flat metallic housing, a disk contained in the housing, and a carriage having a magnetic head. The thickness dimension A of the hard disk drive 15 is, e.g. 5 mm. The storage mechanism, however, is not limited to the hard disk drive 15. The storage mechanism may be, for instance, a flash memory, which is a data nonvolatile IC memory.

The battery 17 functions as a power supply for the portable storage device 11. The thickness dimension B of the battery 17 is, e.g. 9 mm.

The liquid crystal display 14 is an example of a component that adversely affects wireless communication by an antenna element 24 (to be described later). The liquid crystal display 14 is accommodated in the housing 12 at a position near the first wall portion 12C. The liquid crystal display 14 faces to the opening 12E of the first wall portion 12C. Although not shown, the liquid crystal display 14 includes, for example, a glass substrate, a polarizer, a liquid crystal layer, a color filter, a backlight, and a transparent electrode. The transparent electrode is formed of, e.g. ITO (Indium-Tin-Oxide). The transparent electrode includes a first part in which a plurality of wiring lines extend in a column direction, and a second part in which a plurality of wiring lines extend in a row direction. Thus, the transparent electrode has a matrix shape as a whole, and has radio wave absorption properties. The liquid crystal display 14 is situated close to a first surface 22A of a printed wiring board 22 (to be described later). The thickness dimension C of the liquid crystal display 14 is, e.g. 3 mm. Thus, the thickness dimension A of the hard disk drive 15 is greater than the thickness dimension C of the liquid crystal display 14.

The manual input device 16 is an example of the component that adversely affects wireless communication by an antenna element 24 (to be described later). The manual input device 16 is used in order to operate the hard disk drive 15 that is the storage mechanism. The manual input device 16 includes a plurality of input buttons 21. By operating the input buttons 21, the user can instruct data write and data read to the hard disk drive 15. A part of the housing 12, which is located around the manual input device 16, serves as a hold part which is held by the user during use. The manual input device 16 is situated near the first surface 22A (to be described later) of the printed wiring board 22. The thickness dimension D of the manual input device 16 is, e.g. 4 mm.

Figure 4:
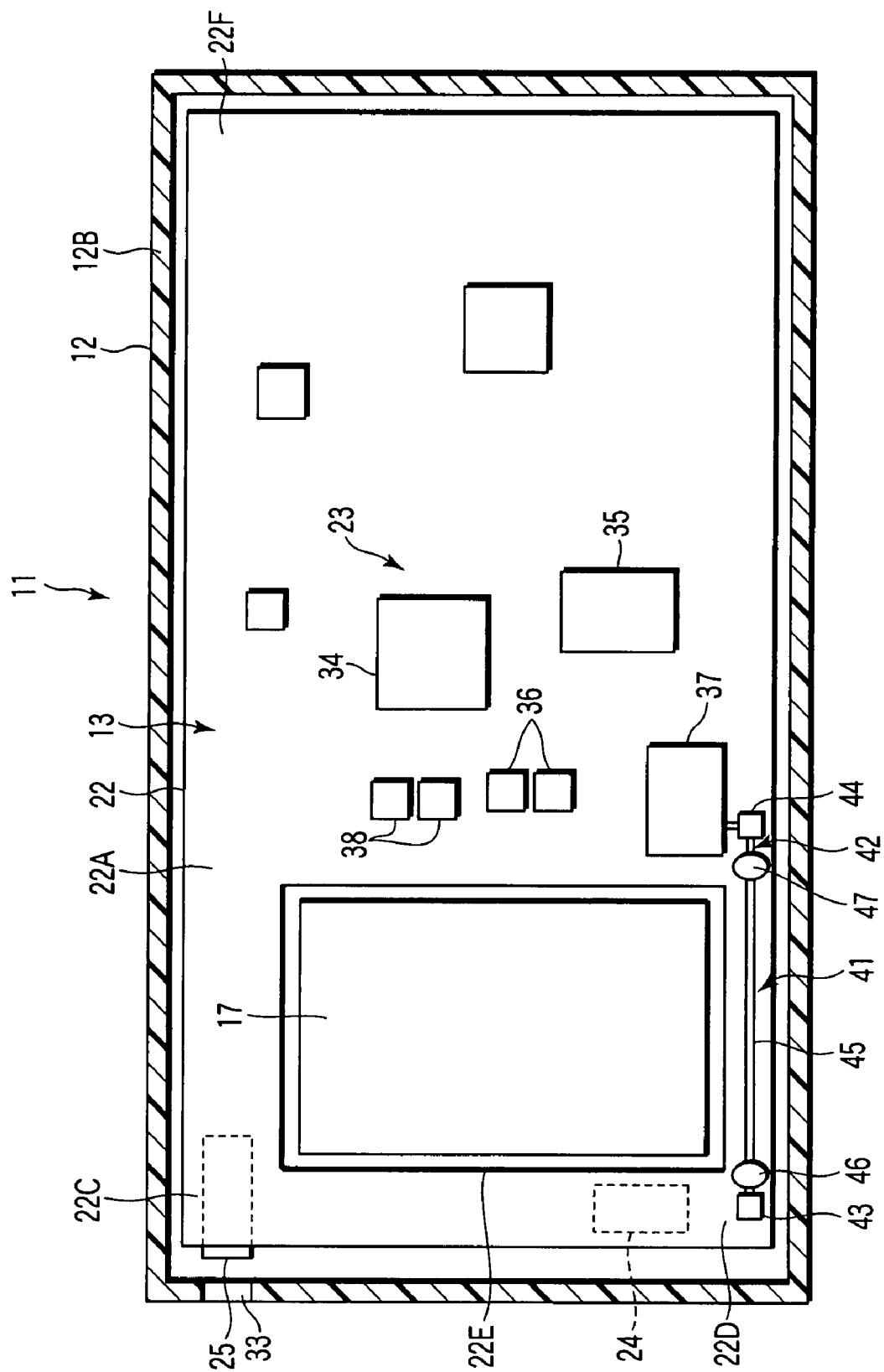
FIG. 4 is an exemplary cross-sectional view, taken along line F4-F4 in FIG. 2, of the portable storage device shown in FIG. 2.

As shown in FIG. 4, the printed circuit board 13 is accommodated in the housing 12 at a position between the liquid crystal display 14 and the hard disk drive 15 that is the storage mechanism. The printed circuit board 13 includes a printed wiring board 22, main circuit components 23 which are mounted on the printed wiring board 22, an antenna element 24 which is mounted on the printed wiring board 22, and a jack 25 in which a plug for an earphone is to be inserted.

Figure 5:
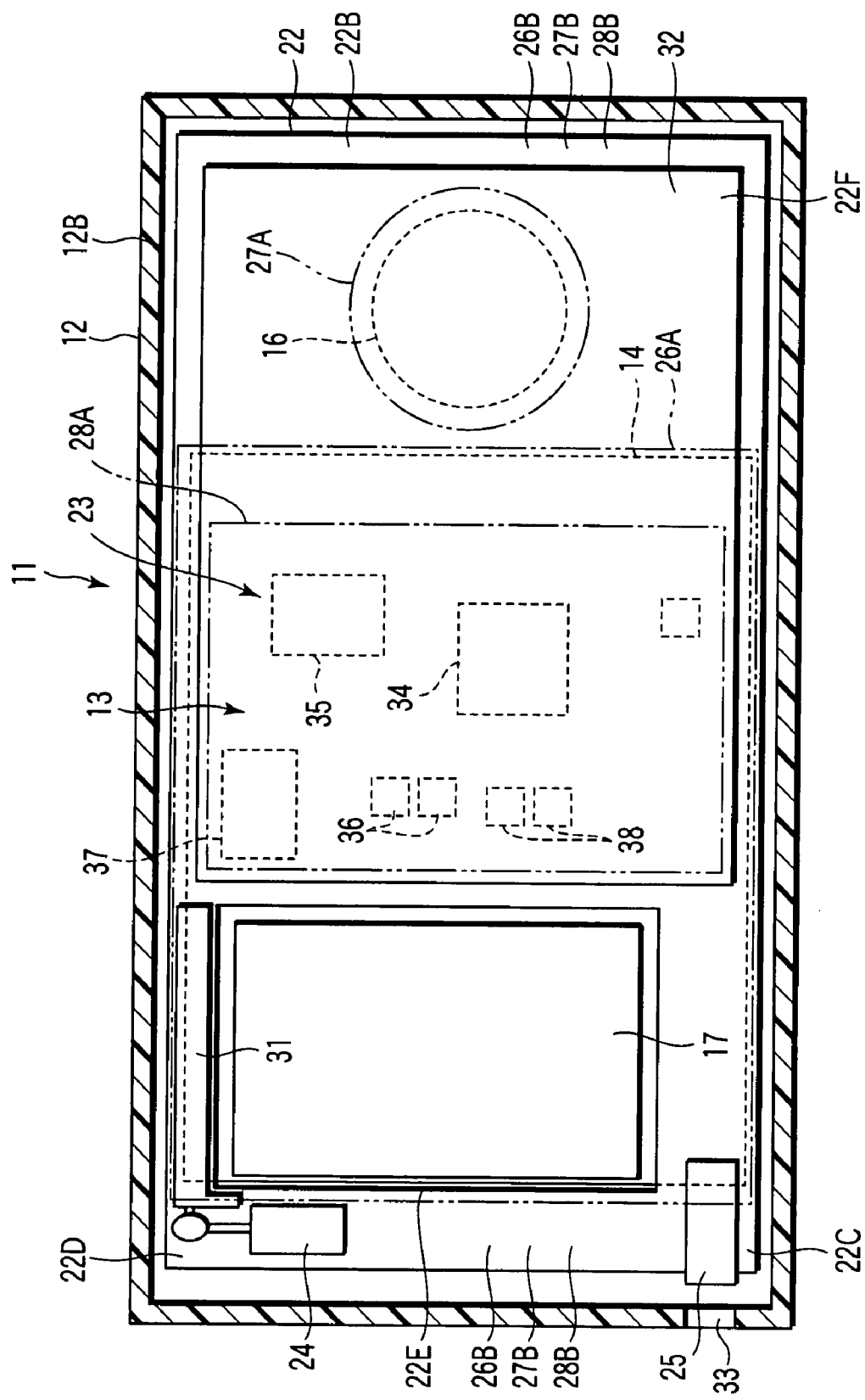
FIG. 5 is an exemplary cross-sectional view, taken along line F5-F5 in FIG. 2, of the portable storage device shown in FIG. 2.

As shown in FIG. 5, the printed wiring board 22 is formed in a rectangular shape. The printed wiring board 22 has a first surface 22A which is located near the liquid crystal display 14, manual input device 16 and main circuit components 23, and a second surface 22B which is located on a side opposite to the first surface 22A. The second surface 22B of the printed wiring board 22 includes a first region 26A corresponding to the liquid crystal display 14, and a second region 26B which is apart from the liquid crystal display 14. The second surface 22B of the printed wiring board 22 includes a first region 27A corresponding to the manual input device 16, and a second region 27B which is apart from the manual input device 16. Further, the second surface 22B of the printed wiring board 22 includes a first region 28A corresponding to the main circuit components 23, and a second region 28B which is apart from the main circuit components 23. The printed wiring board 22 includes a first corner portion 22C, and a second corner portion 22D which is apart from the first corner portion 22C.

The thickness dimension E of the printed wiring board 22 is, e.g. 0.8 mm. The printed wiring board 22 further includes an opening 22E for passing the battery 17. In this portable storage device 11, the battery 17 is passed through the opening 22E and thereby the thickness of the portable storage device 11 is reduced. The battery 17, which is passed through the opening 22E, divides the printed wiring board 22 into a part on which the main circuit components 23 are mounted, and a part on which the antenna element 24 is mounted. Thereby, the antenna element 24 is isolated from the main circuit components 23, and the antenna element 24 can be protected from the radiation of unwanted electromagnetic waves which are emitted from the main circuit components 23.

The printed wiring board 22 further includes a first ground layer 31 which is connected to the antenna element 24, and a second ground layer 32 which corresponds to the part where the main circuit components 23 are mounted. The first ground layer 31 is independent from the second ground layer 32. Each of the first ground layer 31 and second ground layer 32 is formed of a copper thin film. The first ground layer 31 radiates part of the radio waves, which are emitted from the antenna element 24, to the outside, thereby enhancing the performance of wireless communication by the antenna element 24.

The jack 25 is an example of the component that adversely affects the wireless communication by the antenna element 24. The jack 25 is mounted on the first corner portion 22C of the second surface 22B of the printed wiring board 22. The jack 25 is formed, for example, in a cylindrical shape. The jack 25 includes a metallic part and has radio wave absorption properties. The housing 12 has a through-hole 33 in the vicinity of the jack 25, and the jack 25 is exposed from the through-hole 33 to the outside.

The main circuit components 23 are examples of the component that adversely affects the wireless communication by the antenna element 24. As shown in FIG. 4, the main circuit components 23 include, for example, a CPU 34, a ROM (Read-Only Memory) 35, a RAM (Random Access Memory) 36, a wireless module 37 for activating the wireless communication by the antenna element 24, and other circuit components 38. In this embodiment, the wireless module 37 is composed of a wireless chip (W-LAN chip). The CPU 34, ROM 35, RAM 36, wireless module 37 and other circuit components 38 are electrically interconnected over a plurality of wiring lines (not shown). The CPU 34, ROM 35, RAM 36, wireless module 37 and other circuit components 38 mutually execute transaction of an enormous amount of control data, clock signals for timing, and addresses of the RAM 36. Consequently, electromagnetic waves are produced from the main circuit components 23, and the electromagnetic waves may adversely affect the wireless communication by the antenna element 24.

The antenna element 24 is a chip component which transmits and receives radio waves for wireless communication. The antenna element 24 is mounted on the second corner portion 22D of the second surface 22B of the printed wiring board 22. In addition, the antenna element 24 is mounted at a position corresponding to the second region 26B, 27B, 28B of the second surface 22B. Thus, the antenna element 24 is situated at a position apart from the liquid crystal display 14, manual input device 16 and main circuit components 23, and the antenna element 24 is free from adverse effects by these components.

Besides, the antenna element 24 is disposed at a position apart from the hard disk drive 15 and battery 17. Thus, radio waves, which are transmitted/received to/by the antenna element 24, are not absorbed by the hard disk drive 15 and battery 17. The antenna element 24 enables Internet connection near an access point called "Hot Spot", and also enables exchange of, e.g. video data and music data between portable storage devices 11.

An electric circuit 41 is mounted on the printed wiring board 22. As shown in FIG. 6, the electric circuit 41 includes the antenna element 24, the wireless module 37, a signal line 42 for connecting the antenna element 24 and wireless module 37, a first matching circuit 43 which is provided on the signal line 42 in the vicinity of the antenna element 24, and a second matching circuit 44 which is provided on the signal line 42 in the vicinity of the wireless module 37. The signal line 42 can transact a signal with the antenna element 24, and can send the signal to the wireless module 37.

The signal line 42 is an example of the component that adversely affects the wireless communication by the antenna element 24. The signal line 42 includes a coaxial cable 45. The coaxial cable 45 connects the first matching circuit 43 and second matching circuit 44. The coaxial cable 45 includes a metallic part and has such properties as to absorb radio waves which are transmitted/received by the antenna element 24. The coaxial cable 45 is connected, at one end, to the first matching circuit 43 via a connector 46. The coaxial cable 45 is connected, at the other end, to the second matching circuit 44 via a connector 47. The coaxial cable 45 is mounted on the first surface 22A of the printed wiring board 22 and is situated near the first surface 22A. The coaxial cable 45 prevents leak of electromagnetic waves to the surrounding region between the wireless module 37 and antenna element 24.

The first matching circuit 43 and second matching circuit 44 execute impedance matching of the entire electric circuit 41 at, e.g. 50Ω. In the present embodiment, since the matching circuits are provided at two locations, the impedance of the entire electric circuit 41 can be matched more exactly. The antenna element 24 is disposed on the second surface 22B, which is located on the side opposite to the first surface 22A on which the signal line 42 is provided, and thus the antenna element 24 is free from the adverse effect by the signal line 42.

When radio waves are to be transmitted from the portable storage device 11, the wireless module 37 sends a signal toward the antenna element 24. This signal is transmitted to the antenna element 24 via the second matching circuit 44, connector 47, coaxial cable 45, connector 46 and first matching circuit 43. Further, this signal is radiated to the outside as radio waves from the antenna element 24 and the first ground layer 31 which is continuous with the antenna element 24.

On the other hand, when the portable storage device 11 receives radio waves from the outside, the signal that is received by the antenna element 24 is sent to the wireless module 37 via the first matching circuit 43, connector 46, coaxial cable 45, connector 47 and second matching circuit 44. Thereby, the portable storage device 11 can receive music data and image data from the outside. At this time, since the impedance of the electric circuit 41 is exactly matched, the received signal can be transmitted to the wireless module 37 without loss.

Figure 7:
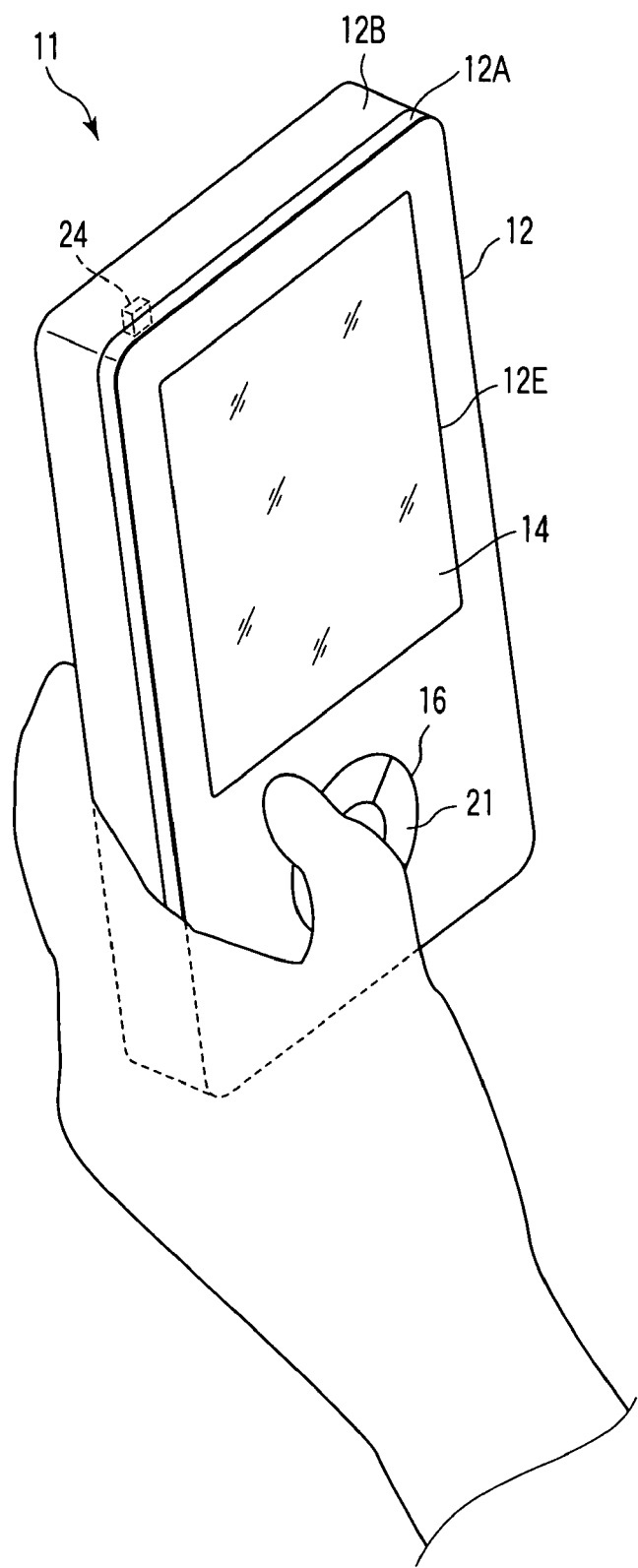
FIG. 7 is an exemplary perspective view showing the state of use of the portable storage device shown in FIG. 1.

Next, referring to FIG. 2 and FIG. 7, the state of use of the portable storage device 11 is described. When the portable storage device 11 is used in the state in which the portable storage device 11 is placed on a top plate 51 of a desk, the user, in usual cases, places the portable storage device 11 on the top plate 51 with the liquid crystal display 14 facing upward, as shown in FIG. 2. While viewing the screen displayed on the liquid crystal device 14, the user operates the manual input device 16.

In this embodiment, the thickness dimension A of the hard disk drive 15 is greater than the thickness dimension C of the liquid crystal display 14. Thus, the printed wiring board 22 is situated at a position on the upper side of an intermediate point of the thickness dimension T of the housing 12. Accordingly, a gap S of a predetermined length is secured between the antenna element 24, which is mounted on the printed wiring board 22, and the top plate 51. Thereby, the antenna element 24 can be positioned apart from the top plate 51, and the wireless communication can be stabilized.

In the case where the user uses the portable storage device 11 by holding it in his/her hand, as shown in FIG. 7, a part of the housing 12 in the vicinity of the manual input device 16 is held by the hand. The antenna element 24 is disposed on the second surface 22B of the printed wiring board 22 at the second region 27B which is apart from the manual input device 16. It is thus possible to prevent the user's hand from interfering with the wireless communication by the antenna element 24.

In this embodiment, as shown in FIG. 5, the jack 25 is provided on the first corner portion 22C, which neighbors the second corner portion 22D. However, the position of the jack 25 is not limited to this example. The jack 25 may be mounted on a corner portion 22F which is positioned diagonal to the second corner portion 22D.

The embodiment of the portable storage device 11 has been described above. According to this embodiment, the antenna element 24 is mounted on the second surface 22B which is opposite to the first surface 22A near the component that adversely affects wireless communication. Thus, the adverse effect of the component can be reduced, and the wireless communication by the antenna element 24 can stably be performed.

In this case, the above-mentioned component is the signal line 42 that transacts a signal with the antenna element 24, that is, the coaxial cable 45. If the coaxial cable 45 and antenna element 24 were mounted on the same surface of the printed wiring board 22, radio waves to be transmitted/received by the antenna element 24 would be absorbed by the signal line 42 itself or the metallic part of the coaxial cable 45. According to the structure of the embodiment, however, radio waves to be transmitted/received by the antenna element 24 can be prevented from being absorbed by these components.

The second surface 22B of the printed wiring board 22 has the first ground layer 31 which is connected to the antenna element 24, and the first ground layer 31 enhances the performance of the wireless communication by the antenna element 24. According to this structure, the radiation performance of radio waves that are transmitted by the antenna element 24 can be improved, and the characteristics of wireless communication can be enhanced. In addition, since the first ground layer 31 is provided on the second surface 22B which is opposite to the first surface 22A that is located near the signal line 42, it is possible to prevent the signal line 42 from deteriorating the effect of the first ground layer 31. Moreover, since the first ground layer 31 is provided at the position on the back side of the coaxial cable 45, there is no need to provide a special space for the provision of the first ground layer 31 on the printed wiring board 22, and the layout on the printed wiring board 22 can efficiently be performed.

The second surface 22B of the printed wiring board 22 includes the first region 26A, 27A, 28A, which corresponds to the above-mentioned component, and the second region 26B, 27B, 28B, which is apart from the above-mentioned component. The antenna element 24 is mounted on the second region 26B, 27B, 28B. According to this structure, the antenna element 24 can be mounted at the position apart from the component that adversely affects the wireless communication.

In this case, the above-mentioned component is the liquid crystal device 14, and the liquid crystal device 14 has the matrix-shaped electrode. According to this structure, the antenna element 24 can be disposed on the second region 26B that is apart from the liquid crystal display 14. Therefore, it is possible to prevent the wireless communication by the antenna element 24 from being hindered by the radio wave absorption properties of the liquid crystal display 14, and the wireless communication can be stabilized.

Further, in this case, the above-mentioned component is the manual input device 16 for operating the hard disk drive 15 that is the storage mechanism. The antenna element 24 is disposed on the second region 27B that is apart from the manual input device 16. The user uses the portable storage device 11 by holding the part of the housing 12 around the manual input device 16. It is generally known that the human body has radio wave absorption properties. According to the above-described structure, the antenna element 24 can be disposed at the position apart from the region that is held by the user. Thereby, it is possible to prevent the user's hand from adversely affecting the wireless communication by the antenna element 24.

Further, in this case, the above-mentioned component is the main circuit components 23 which are mounted on the first surface 22A of the printed wiring board 22. Thus, the antenna element 24 is disposed on the second region 28B that is apart from the main circuit components 23. According to this structure, it is possible to prevent the wireless communication from being disturbed by the effect of electromagnetic waves which are produced from the main circuit components, and to stabilize the wireless communication by the antenna element 24.

The jack 25 is mounted on the first corner portion 22C of the printed wiring board 22, and the antenna element 24 is mounted on the second corner portion 22D of the printed wiring board 22. According to this structure, since a free space is secured around the antenna element 24, the wireless communication characteristics of the antenna element 24 can be enhanced. Moreover, the metallic jack 25 having radio wave absorption characteristics can be disposed at a position which is as far as possible from the antenna element 24. Thereby, it is possible to prevent the jack 25 from adversely affecting the wireless communication by the antenna element 24.

The liquid crystal display 14 is accommodated in the housing 12 at a position near the first wall portion 12C, the hard disk drive 15 is accommodated in the housing 12 at a position near the second wall portion 12D, and the printed wiring board 22 is accommodated in the housing 12 at a position between the liquid crystal display 14 and hard disk drive 15. The thickness dimension of the hard disk drive 15 is greater than the thickness dimension of the liquid crystal display 14. According to these structures, when the portable storage device 11 is used in the state in which the portable storage device 11 is placed on the top plate 51 of the desk with the liquid crystal display 14 positioned on the upper side and the hard disk drive 15 positioned on the lower side, the antenna element 24 can be disposed at the position apart from the top plate 51. Thereby, it is possible to eliminate the effect of radio wave absorption by the top plate 51 of the desk, and to stabilize the wireless communication by the antenna element 24.

The electric circuit 41 includes the first matching circuit 43 which is provided on the signal line 42 in the vicinity of the antenna element 24, and the second matching circuit 44 which is provided on the signal line 42 in the vicinity of the wireless module 37. According to this structure, since the first and second matching circuits 43, 44 are provided at two locations, i.e. in the vicinity of the antenna element 24 and in the vicinity of the wireless module 37, the impedance matching of the electric circuit 41 can exactly and easily be achieved. Thereby, the electrical loss of the signal propagating through the signal line 42 can be reduced. The signal line 42 includes the coaxial cable 45 which connects the antenna element 24 and the wireless module 37. The coaxial cable 45 connects the first matching circuit 43 and second matching circuit 44. According to this structure, electromagnetic waves can be prevented from leaking to the outside between the first matching circuit 43 and second matching circuit 44. Thereby, the wireless communication performance of the antenna element 24 can be improved.

The electronic device and electric circuit according to the present invention are applicable not only to the portable storage device, but also to other electronic devices such as a mobile phone and a portable computer. Needless to say, the electronic device and electric circuit can be modified and implemented without departing from the spirit of the present invention.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a housing;
   a storage mechanism configured to store data and which is accommodated within the housing;
   a printed wiring board which is accommodated within the housing;
   an antenna element which is mounted on the printed wiring board and executes wireless communication; and
   a manual input device which has radio wave absorption properties and is configured to operate the storage mechanism,
   wherein the printed wiring board includes a first surface which is located near the manual input device, a second surface which is located on a side opposite to the first surface, and one end which is located near the manual input device and another end which is located on a side opposite to the one end, and
   wherein the antenna element is mounted on the second surface and on the another end.

2. The electronic device according to claim 1, further comprising:
   a signal line which transacts a signal with the antenna element,
   the antenna element is mounted apart from the signal line.

3. The electronic device according to claim 2, wherein the second surface of the printed wiring board includes a first ground layer which is connected to the antenna element, and the first ground layer enhances a performance of the wireless communication by the antenna element.

4. The electronic device according to claim 2, further comprising:
   a liquid crystal display which includes a matrix-shaped electrode,
   wherein the antenna element is mounted apart from the liquid crystal display.

5. The electronic device according to claim 4 further comprising:
   a main circuit component which is mounted on the first surface of the printed wiring board,
   wherein the antenna element is mounted apart from the main circuit component.

6. The electronic device according to claim 1,
   wherein the printed wiring board includes a first corner portion on which a jack, that accommodates a plug, is mounted, and a second corner portion which is apart from the first corner portion, and
   wherein the antenna element is mounted on the second corner portion.

* * * * *